United States Patent [19]
Sterbal

[11] 3,935,501
[45] Jan. 27, 1976

[54] MICRO-MINIATURE LIGHT SOURCE ASSEMBLAGE AND MOUNTING MEANS THEREFOR

[75] Inventor: Silvester Sterbal, Staten Island, N.Y.

[73] Assignee: Digital Components Corporation, Linden, N.J.

[22] Filed: Feb. 13, 1975

[21] Appl. No.: 549,828

[52] U.S. Cl............ 313/499; 174/52 PE; 313/512; 357/68; 357/72; 357/75
[51] Int. Cl.² ................................. H05B 33/02
[58] Field of Search ........... 313/512, 499, 501, 500; 357/72, 68, 75; 174/52 PE, 52 FP

[56] References Cited
UNITED STATES PATENTS

| | | | |
|---|---|---|---|
| 3,533,965 | 10/1970 | Ikeda et al. | 357/72 X |
| 3,694,902 | 10/1972 | Apgar et al. | 357/72 X |
| 3,711,789 | 1/1973 | Dierschke | 313/500 X |
| 3,739,241 | 6/1973 | Thillays | 313/512 X |
| 3,763,403 | 10/1973 | Lootens | 357/72 X |
| 3,793,709 | 2/1974 | Baumann | 357/68 X |

*Primary Examiner*—Palmer C. Demeo
*Attorney, Agent, or Firm*—Howard E. Thompson, Jr.

[57] ABSTRACT

A micro-miniature light source assemblage is provided having enhanced mechanical strength, maximum light output, and versatile accommodation for other integrated circuit components by employing as mounting for the LED (light emitting diode) a preassemblage of electric leads having an overlapped and insulated bond which is durable and permits flexibility in the orientation of said leads in use.

The preassemblage of leads can also provide for mounting of other solid state devices, and special adaptations include offset and/or reduced thickness portions of said leads at the bond area as well as a modification in which an integral extension of one lead forms the electrical connection to an LED or other device mounted on the other lead.

12 Claims, 11 Drawing Figures

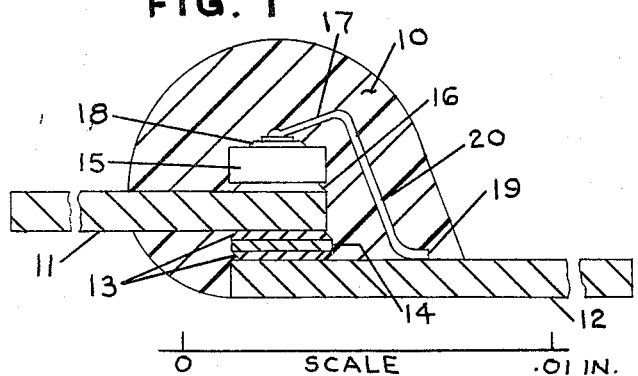
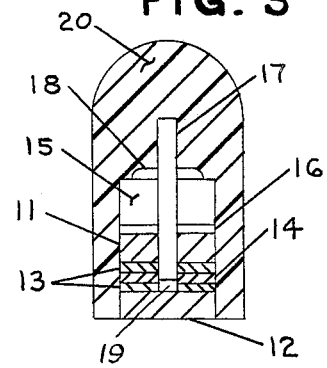
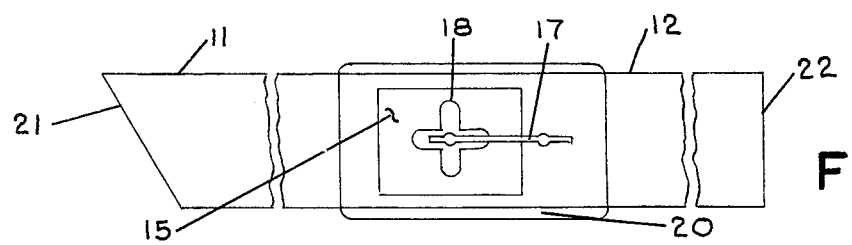
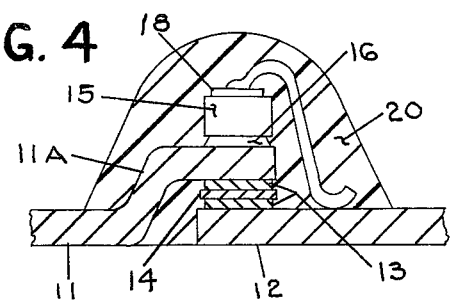
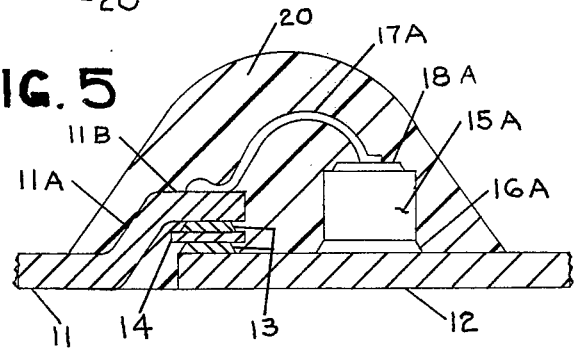
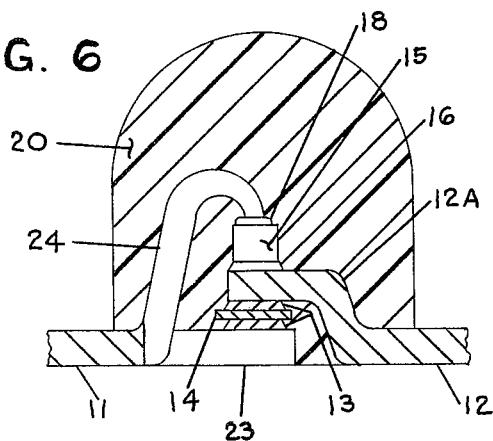
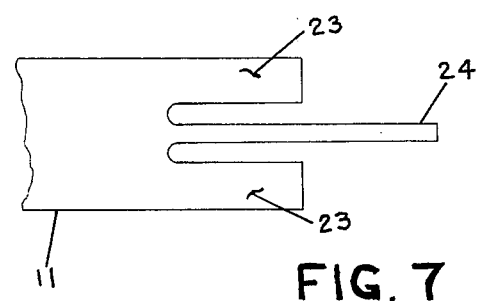

MICRO-MINIATURE LIGHT SOURCE ASSEMBLAGE AND MOUNTING MEANS THEREFOR

This invention relates to a micro-miniature light source assemblage having enhanced mechanical strength, maximum light output, and versatile accomodation for other integrated circuit components by employing as mounting for the LED (light emitting diode) a preassemblage of electric leads having an overlapped and insulated bond which is durable and permits flexibility in the orientation of said leads in use.

The preassemblage of leads can also provide for mounting of other solid state devices, and special adaptations include offset and/or reduced thickness portions of said leads at the bond area as well as a modification in which an integral extension of one lead forms the electrical connection to an LED or other device mounted on the other lead.

There has developed in recent years extensive use in digital watches, calculators and other instruments of electrically actuated and illuminated characters where the identity of characters depends on selective activation of associated light emission bars, and each bar is made up of a plurality of closely spaced LED (light emitting diode) devices. Such devices are basically well-known in the art, and a good summary of the characteristics, color emission, and the like of LED devices can be found in an article "LED Technology" by M. C. Craford and D. L. Keune which appeared in Solid State Technology for Jan. 1974.

An object of the present invention is to provide a micro-miniaturized package or assemblage which better fills the need in the illumination of digital watches, pocket calculators and other small instruments by providing such assemblages of a size which can be assembled as close as about 0.01 inch on centers while at the same time providing the ruggedness and durability needed during assemblage and use of such instruments. The unusually small size is desirable in instruments of the type mentioned not only because of the limitation of available space but also as a means for enlarging the contrast ratio between the energized and nonenergized states, as the nonenergized device becomes hardly visible because of its small dimension.

The key to the size reduction achieved in accordance with the present invention resides primarily in the unique manner of providing an insulating bond between two overlapped electric leads for the device which assures a tensile strength substantially equivalent to that of the leads themselves and which at the same time permits the mounting of a LED device to expose to a maximum extent the light emitting surfaces thereof. Light emission is enhanced by a lens-like encapsulation of the lead juncture and LED device in a body of clear plastic material, suitably a thermosetting epoxy composition.

The dimensions of the micro-assemblage can be varied within limits in adapting to the space accomodations in varied uses as for example by mounting the LED device on top of the lead juncture, by mounting on one lead closely spaced from the juncture is vertical space is at a premium, or even on a juncture of reduced thickness if both longitudinal space and vertical space are at a premium.

The preassemblage of leads and the durability provided by the overlapped and insulated bond therebetween lends itself to the mounting of other semi-conductors and integrated circuit components in place of or in addition to the LED device. In this connection, however, it will be understood that the use of clear encapsulant is important only when the assemblage includes an LED device. When the preassembled leads are employed for the mounting only of other type semiconductors or the like, an opaque encapsulant can be employed.

The invention will be more fully understood from a consideration of the following description having referecne to the accompanying drawing in which certain adaptations of the invention have been illustrated with the components identified by suitable reference characters in the several views, and in which;

FIG. 1 is a sectional view through a light emitting assemblage in accordance with the present invention.

FIG. 2 is a plan view of the assemblage shown in FIG. 1.

FIG. 3 is a sectional view substantially on the broken line 3—3 of FIG. 1.

FIGS. 3, 4 and 5 are sectional views similar to FIG. 1, showing modified arrangements of components.

FIG. 7 is a fragmentary plan view of one of the leads shown in FIG. 6 prior to assemblage.

Figure 8:
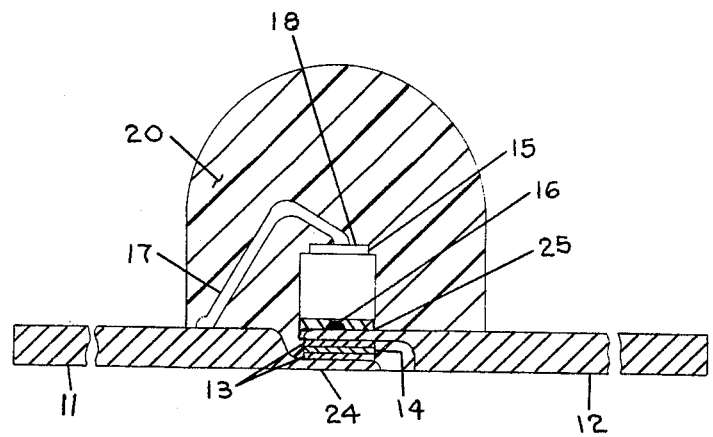
FIG. 8 is a view similar to FIG. 1 showing round leads which are flattened at the point of juncture.

As shown in FIGS. 1–3 of the drawings, an assemblage 10 in accordance with the present invention comprises leads 11 and 12 having overlapped ends bonded together as at 13 by epoxy resin or other cement having good electrical insulating properties. For devices intended to operate at low voltages as for example three volts or lower, such cement can provide ample insulation between the overlapped lead ends. For devices intended to operate at higher voltages, however, it is preferable to interpose between layers of cement 13 a thin plate of mica or other insulating material 14 having an area approximately equal to or slightly greater than the overlapped lead ends.

The leads 11, 12 have been shown in FIGS. 1–3 as having a flat or ribbon-like contour, and while leads of this type are considered preferable, it is possible in this and other adaptations of the invention to employ round wire leads with flattened ends as more fully hereinafter described.

The bond provided between the substantially overlapped lead ends imparts a tensile strength to the subassemblage which is substantially as great as the leads themsleves.

Attention is directed to the scale interposed between FIGS. 1 and 2 and to the indication of shortening 11, 12 the illustration of the leads 11,12. In reality the overall length of the leads may be 50 to 100 times the longitudinal dimension of the juncture assemblage 10.

In the illustration shown in FIGS. 1–3 an LED device or chip 15 is mounted to the lead 11 in alignment with the overlapped end assemblage of the leads 11, 12 by a conductive bonding means 16 such as eutectic solder or electrically conductive epoxy resin. To complete the circuit for the LED chip a very thin wire 17 is welded to the top contact 18 of the LED chip and to the lead 12 as seen at 19, after which the assemblage is enveloped in a mass of clear plastic material 20. This can suitably be a clear epoxy resin which is applied as liquid or semi-liquid and which after setting forms a hard clear mass which not only protects and strengthens the assemblage but also acts as a lens, enhancing the apparent size of the LED device.

As shown in FIGS. 1 and 3 the lens forming mass 20 extends somewhat along the leads 11, 12 but extends only slightly beyond the width of the assemblage. This configuration, which is desirable to facilitate close packing of a series of such assemblages to form illuminating bars and the like, tends to be assumed automatically by reason of the overall shape of the assemblage, but flattening of the sides as shown in FIG. 3 can be assisted if necessary by applying pressure to sides of the mass 20 before the setting thereof is complete.

In an assemblage as above described, when electrically activated by current of a proper direction or bias, the LED device emits light of a characteristic color depending upon its particular composition as described in the above mentioned publication LED Technology. In order to facilitate proper orientation of the assemblage in the particular circuit with which it is to be used, it is desirable that the leads 11 and 12 be characterized for easy identification. In some instances this is achieved by using wire of different composition and color in the leads 11 and 12. When both leads are the same color, however, one lead can be otherwise characterized as for example by means of a diagonal end cut 21 characterizing the lead 11 and contrasting with the square cut 22 which characterizes the lead 12 as shown in FIG. 2.

While a certain amount of color selection is possible, by selecting a LED device of appropriate composition, the colors red, green and yellow or amber being readily available, it should be understood that the color of emitted light can, if desired, be slightly modified by adding appropriate transparent color to the clear plastic of the encapsulant and lens 20.

While the basic principles of the present invention are embodied in the assemblage shown in FIGS 1–3, several modifications have been illustrated in the drawing to permit better visualizing of the versatility of the new technique. For ease of comparison the same reference characters have been applied to the corresponding components in all figures of the drawing.

FIG. 4 shows an assemblage quite similar to that shown in FIG. 1, the difference being that one of the leads 11 is sharply offset as seen at 11a closely adjacent the bonded end to establish a coplanar orientation of the leads 11, 12. Whether such coplanar orientation or the slight offset of the leads 11, 12 as shown in FIG. 1 is preferred may depend in part on the space accommodations of the instrument in which the assemblage is to be used.

FIG. 5 corresponds generally with FIG. 4 in showing the coplanar orientation of the leads 11,12 but provides a flatter profile by having the LED device 15A bonded to the lead 12 by electrically conductive solder or cement 16A and having the fine wire 17A extend from the top contact 18A of the LED device to the bonded end 11b of the lead 11. In making this change it will be recognized that if the current flow in FIG. 4 was from lead 11 through the LED device 15 to the lead 12, then in FIG. 5 the current flow must be from the lead 12 through the relocated LED device 15A to the lead 11.

FIGS. 6 and 7 show a modified construction which eliminates the need for the separate fine wire 17 or 17A by specially fashioning the end of one of the leads 11 to provide a pair of bonding members 23 slightly spaced from a central integral extension 24 long enough to be reshaped as seen in FIG. 6 and welded to the top contact 18 of the LED device 15. In FIG. 6 lead 12 has been shown as having a sharp offset 12A adjacent the bonding area thereby establishing the coplanar orientation of the leads 11, 12 which may for some purposes be desirable as above described.

As the assemblage shown in FIG. 6 has the base of the LED unit electrically bonded to the lead 12 and the top contact joined directly to the lead 11, the current flow through the device must be the same as would be applicable with the arrangement shown in FIG. 5.

Figure 8A:
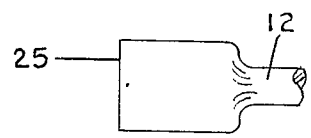
FIG 8a is a fragmentary showing of one of the leads in FIG. 8 with the flattened end in plan view.

FIG. 8 and 8a illustrates an assemblage in which the leads 11, 12 are in the form of wires of round cross section rather than the strip or ribbon configuration of the earlier figures. Flattened ends 24, 25 permit firm bonding together of the overlapped leads as seen in FIG. 8 by means of electrically insulating cement 13 and interposed insulating plate 14 if needed as earlier described. The flattened end 25 of the lead 12 also provides for the firm bonding of LED device 15 by conductive cement or solder 16. With the fine wire 17 extending from top contact 18 to the lead 11, it will be apparent that current through this device must flow in the same direction as in FIGS. 5 and 6.

Figure 9:
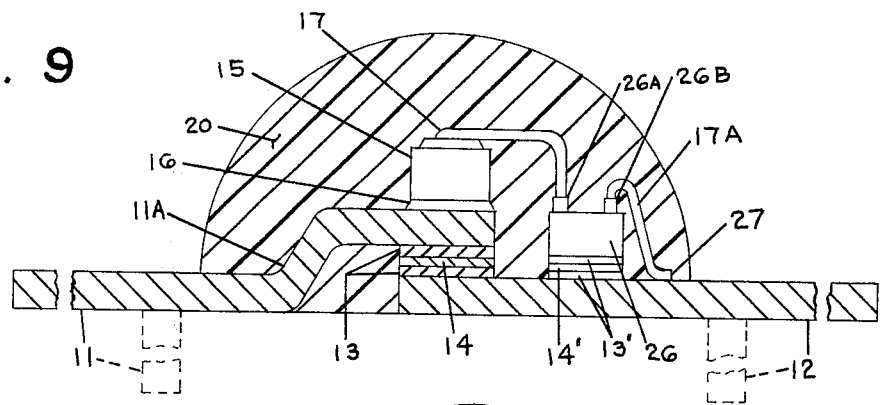
FIG. 9 is a view similar to FIG. 4 but including a second electronic component.

FIG. 9 shows an assemblage generally similar to that shown in FIG. 4 in which a second electronic component 26 is in series circuit the LED device 15. The component 26 has been shown as mounted on lead 12 by insulating cement 13' which may be supplemented as desired by insulating sheet 14'. In this arrangement a fine wire 17 extends from the LED device 15 to a first contact point 26A on component 26, and a second fine wire 17A extents from a second contact point 26B to a welding contact with lead 12 as seen at 27.

Figure 10:
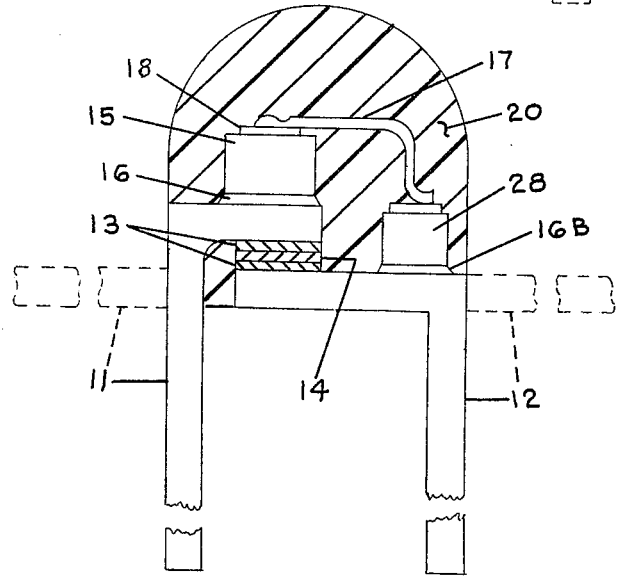
FIG. 10 is a view similar to FIG. 9 but showing a second electronic component of a different type, and in more compact arrangement.

In FIG. 10 there is shown a modified arrangement of dual mounting of components related to that shown in FIG. 9 but differing in that the second component 28 is placed in circuit by top and bottom contacts. In this instance component 28 is mounted on the lead 12 by electrically conductive solder or cement 16B, and the fine wire 17 extends from the top of component 28 to the top of the LED device 15.

In FIG. 9 the leads 11, 12 have been shown in full lines as disposed in coplanar orientation and in dotted lines as disposed in paralled orientation, while in FIG. 10 the full line and dotted line showings have been reversed. The orientation of the leads 11, 12 which will be best suited to particular uses of the assemblage will depend upon the type and available space of instruments in which the assemblage is to be mounted. it is intended that the full and dotted line showing of the leads in FIGS. 9 and 10 convey to the reader an appreciation of the fact that reshaping or reorientation of the leads as convenient for different uses of the various assemblages is intended and that the firmness of bonding between the leads 11, 12 and the protected support of LED and other components thereon permits such reshaping or reorientation of the leads without concern for damage to or impairment to the performance of the assemblage.

While the various structural arrangements above described are particularly intended and adapted for the mounting of LED devices, it is to be understood that the preassemblage of leads 11, 12 in the various ways above described can be useful in the mounting of various micro solid state devices other than light emitting devices. In such event the details of assembly and the general materials employed above described will be applicable with the exception that since no light would be emitted, the encapsulant material 20 can be opaque plastic.

Various changes and modifications in the micro-miniature assemblages of solid stat devices and the mounting means thereof as herein described may occur to those skilled in the art, and to the extend that such changes and modifications are embraced by the appended claims, it is to be understood that they constitute part of the present invention.

I claim:

1. A micro-miniature electrical assemblage comprising a pair of wire leads having overlapped ends, said ends, at the overlapped positions only thereof, being joined by bonding means providing both electrical insulation and physical strength, thereby forming a subassemblage having a central bonded juncture with the leads divergently projecting therefrom and freely deformable with respect thereto, a solid state electrical component having top and bottom contacts, said component being joined at the bottom thereof to one of said leads by electrically conductive bonding means, fine wire means electrically bonded to the top of said component and to the other of said leads, and said bonded juncture and associated solid state component being enveloped by a hardened mass of plastic material having electrical insulating properties.

2. A micro-miniature electrical assemblage as defined in claim 1, wherein said solid state electrical component is a light emitting diode (LED) device, and said plastic material is clear and of lens-like contour to thereby enhance light emission of said device in a direction perpendicularly to the plane of said bonded juncture.

3. A micro-miniature electrical assemblage as defined in claim 1, wherein said leads are of flat, ribbon-like contour.

4. A micro-miniature electrical assemblage as defined in claim 3, wherein at least one of said leads is offset adjacent the point of juncture to dispose the major portion of said leads in a common plane.

5. A micro-miniature electrical assemblage as defined in claim 3, wherein the juncture portion of one of said leads comprises transversely spaced tabs for bonding with said other lead, and said first lead having an integral fine extension between and extending beyond said tabs, and said extension providing the fine wire means for completing electrical circuit to the top of a solid state electrical component electrically bonded to said other lead.

6. A micro-miniature electrical assemblage as defined in claim 3, wherein said solid state electrical component is mounted over the juncture of said leads to thereby minimize the dimension of said assemblage longitudinally of said leads.

7. A micro-miniature electrical assemblage as defined in claim 3, wherein said solid state electrical component is mounted on one of said leads adjacent said juncture to thereby minimize the dimensions of said assemblage perpendicularly to said leads.

8. A micro-miniature electrical assemblage as defined in claim 3, wherein a second electrical component is included in said assemblage in circuit with said solid state electrical component.

9. A micro-miniature electrical assemblage as defined in claim 8, wherein said second component has a bottom contact and is bonded to one of said leads by electrically conductive means.

10. A micro-miniature electrical assemblage as defined in claim 8, wherein said second component has no bottom contact and is bonded to one of said leads by electrically insulating means.

11. A micro-miniature electrical assemblage as defined in claim 3, wherein said hardened mass of plastic material extends only slightly beyond the width of said ribbon-like leads to thereby permit the close packing of a plurality of said assemblages in side-by-side arrangement.

12. A micro-miniature electrical assemblage as defined in claim 1, wherein said leads are wires of circular cross section, and end portions thereof are flattened to provide juncture areas which are substantially thinner and substantially wider than the wire diameter, and said solid state electrical component being joined to one of said flattened portions by said electrically conductive bonding means.

* * * * *